United States Patent
Yamada et al.

(10) Patent No.: US 8,803,263 B2
(45) Date of Patent: Aug. 12, 2014

(54) MAGNETIC MEMORY ELEMENT AND STORAGE DEVICE USING THE SAME

(75) Inventors: Michiya Yamada, Hino (JP); Yasushi Ogimoto, Higashiyamato (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 539 days.

(21) Appl. No.: 13/061,946

(22) PCT Filed: Jul. 8, 2009

(86) PCT No.: PCT/JP2009/062421
§ 371 (c)(1),
(2), (4) Date: Jun. 3, 2011

(87) PCT Pub. No.: WO2010/026831
PCT Pub. Date: Mar. 11, 2010

(65) Prior Publication Data
US 2012/0012954 A1 Jan. 19, 2012

(30) Foreign Application Priority Data
Sep. 3, 2008 (JP) ................................ 2008-226446

(51) Int. Cl.
*H01L 29/82* (2006.01)

(52) U.S. Cl.
USPC .................. 257/421; 257/295; 257/E29.167; 257/E29.323; 257/E27.104; 438/3

(58) Field of Classification Search
USPC .................. 257/295, E27.104, 421, E29.167, 257/E29.323; 438/3; 365/145, 158
See application file for complete search history.

(56) References Cited

U.S. PATENT DOCUMENTS

| | | | |
|---|---|---|---|
| 6,365,286 B1* | 4/2002 | Inomata et al. | 428/811.1 |
| 6,992,359 B2* | 1/2006 | Nguyen et al. | 257/421 |
| 2002/0117727 A1* | 8/2002 | Engel et al. | 257/421 |
| 2006/0118842 A1 | 6/2006 | Iwata | |
| 2007/0297220 A1 | 12/2007 | Yoshikawa et al. | |
| 2008/0164502 A1 | 7/2008 | Fukumoto et al. | |

FOREIGN PATENT DOCUMENTS

| | | |
|---|---|---|
| EP | 1705665 A1 | 9/2006 |
| JP | 2003-110166 A | 4/2003 |
| JP | 2005-109201 A | 4/2005 |

(Continued)

OTHER PUBLICATIONS

Japanese Office Action dated Dec. 11, 2012 with partial English translation.

(Continued)

*Primary Examiner* — Kenneth Parker
*Assistant Examiner* — John Lin
(74) *Attorney, Agent, or Firm* — Rabin & Berdo, P.C.

(57) ABSTRACT

An object of the invention is to ensure the thermal stability of magnetization even when a magnetic memory element is miniaturized. A magnetic memory element includes a first magnetic layer (22), an insulating layer (21) that is formed on the first magnetic layer (22), and a second magnetic layer (20) that is formed on the insulating layer (21). At least one of the first magnetic layer (22) and the second magnetic layer (20) is strained and deformed so as to be elongated in an easy magnetization axis direction of the magnetic layer (22) or (20) or compressive strain (101) remains in any direction in the plane of at least one of the first magnetic layer and the second magnetic layer.

7 Claims, 6 Drawing Sheets

(56) References Cited

FOREIGN PATENT DOCUMENTS

| | | |
|---|---|---|
| JP | 2005-123488 A | 5/2005 |
| JP | 2008-010590 A | 1/2008 |
| WO | WO-2005-082061 A2 | 9/2005 |
| WO | WO-2006-054588 A1 | 5/2006 |

OTHER PUBLICATIONS

European Search Report dated Jan. 3, 2013.

Inomata Koichiro, "Non-volatile magnetic memory MRAM," Kogyo Chosakai Publishing Co., Ltd., Nov. 2005.

* cited by examiner

MAGNETIC MEMORY ELEMENT AND STORAGE DEVICE USING THE SAME

TECHNICAL FIELD

The present invention relates to a magnetic memory element using a magnetoresistive effect and a storage device using the magnetic memory element, and more particularly, to a magnetic memory element and a storage device using stress or strain generated in a formed magnetic layer.

BACKGROUND ART

In recent years, a non-volatile storage device (MRAM: Magnetoresistive Random Access Memory) using a magnetic memory element has been developed. For example, a magnetic memory element shown in FIG. 1 is given as an example of the related art. FIG. 1 is an enlarged cross-sectional view illustrating a portion including a magnetic memory element 100 in a storage device 10 including the magnetic memory element 100. The magnetic memory element 100 includes a magnetic tunnel junction (MTJ) portion 13, and the MTJ portion 13 is sandwiched between a lower electrode 14 and an upper electrode 12. The MTJ portion 13 has a multi-layered structure of a fixed layer 22, an insulating layer 21, and a recording layer 20 formed on the lower electrode 14 in this order. The fixed layer 22 and the recording layer 20 are made of a ferromagnetic material. The lower electrode 14 is connected to a drain region 24 provided in a substrate 15, and a source region 25 is also provided in the substrate 15 at a predetermined distance from the drain region 24. A gate line 16 is formed above the drain region 24 and the source region 25 so as to be insulated therefrom. In this way, a MOSFET (metal oxide semiconductor field effect transistor) having the terminals of the drain region 24, the source region 25, and the gate line 16 is formed. In addition, a contact portion 17 and a word line 18 are formed in this order on the source region 25. The upper electrode 12 is connected to a bit line 11. The word line 18 and the bit line 11 are insulated from each other by an interlayer insulating film 23 and are connected to a control circuit (not shown). The storage device 10 selects the magnetic memory element 100, reads information stored in the magnetic memory element 100, and writes information to the magnetic memory element 100.

Next, the principle of a data read operation of the magnetic memory element 100 will be described. First, the insulating layer 21 is provided between the recording layer 20 and the fixed layer 22, and the insulating layer 21 has a small thickness of 3 nm or less. Therefore, when an external voltage is applied, a small amount of current (tunnel current) flows from the recording layer 20 to the fixed layer 22 through the insulating layer 21. Since the recording layer 20 and the fixed layer 22 are ferromagnetic bodies, they have spontaneous magnetization (hereinafter, simply referred to as "magnetization"), and the tunnel current is increased or decreased by a combination (magnetization arrangement) of the magnetization directions of the recording layer 20 and the fixed layer 22. That is, when the direction of the magnetization 102A of the recording layer 20 is identical to (parallel to) the direction of the magnetization 102B of the fixed layer 22, the tunnel current passing through the insulating layer 21 increases. On the other hand, when the direction of the magnetization 102A of the recording layer 20 is opposite to (anti-parallel to) the direction of the magnetization 102B of the fixed layer 22, the tunnel current decreases. This property is called a tunneling magnetoresistance effect, which is described in detail in Non-patent Document 1: Inomata Koichiro, "Non-volatile magnetic memory MRAM," Kogyo Chosakai Publishing Co., Ltd., November 2005 (hereinafter Non-patent Document 1).

This property can be used to determine whether the magnetization directions of the recording layer 20 and the fixed layer 22 are identical to each other, which is defined as "0", or the magnetization directions of the recording layer 20 and the fixed layer 22 are opposite to each other, which is defined as "1", on the basis of the magnitude of the tunnel current. That is, when the direction of the magnetization 102B of the fixed layer 20 is fixed, it is possible to read information stored in the recording layer 20 as the magnetization direction. The magnetization directions of the recording layer 20 and the fixed layer 22 are maintained even when energy, such as a current, is not supplied. Therefore, when the magnetic memory element 100 shown in FIG. 1 is integrated, it is possible to achieve a non-volatile storage device (memory) that retains data even when the power source is turned off.

Next, the principle of a data write operation will be described. In the related art, in order to write data, a method has been used in which a magnetic field is generated in the vicinity of the recording layer 20 due to a current and the magnetization direction of the recording layer 20 is changed by the magnetic field. However, in this method, as the size of an element is reduced, the amount of current required for a write magnetic field increases. As such, since the current value increases with a reduction in the size of the element, it is difficult to reduce the size of the magnetic memory element, that is, to increase recording density. Therefore, in recent years, a method has been used which makes a spin-polarized current flow from the fixed layer 22 to the recording layer 20 to control the magnetization direction of the recording layer 20. This method is called an STT (Spin Torque Transfer) method and is described in detail in Non-patent Document 1. In the STT method, a spin-polarized current for writing is reduced with a reduction in the size of the element. Therefore, it is easy to increase recording density.

A gigabit-class magnetic memory device has been developed by the use of the perpendicular magnetization film and the STT method. The magnetic memory element shown in FIG. 1 has the same operation as the magnetic memory element disclosed in Patent Document 1: U.S. Patent Application Publication No. 2007/297220.

DISCLOSURE OF INVENTION

Problems to be Solved by the Invention

However, when the magnetic memory element is integrated to manufacture an MRAM, there is a problem in that the thermal stability of recorded magnetization is damaged.

In general, $KuV/k_BT$ is used as a factor, which is an index of the thermal stability of the magnetization of a ferromagnetic layer (where V is the volume of the ferromagnetic layer, $k_B$ is the Boltzmann constant, and T is the temperature). From this relationship, when the shape of the ferromagnetic layer is given, the thermal stability is determined by only the magnetic anisotropy energy Ku and the temperature T. As described above, since a magnetic anisotropy energy varies depending on the internal stress of the magnetic layer, the thermal stability of the recorded magnetization of the magnetic memory element varies depending on the internal stress of the recording layer 20. In order to integrate the magnetic memory element to be used as an MRAM, it is necessary to set the value of a thermal stability factor $KuV/k_BT$ to 60 or more. That is, in order to manufacture an MRAM, it is necessary to increase the thermal stability of the magnetization of the magnetic layer in each element. In order to increase the thermal stability, the magnetic anisotropy energy Ku needs to increase.

When the magnetic memory element is integrated to manufacture an MRAM, a semiconductor integrated circuit manufacturing process is used. However, in this case, a stress of about 100 MPa remains in the element. The inventors consider that the thermal stability is reduced due to a residual stress. That is, when an internal stress σ is generated in the magnetic layer by the semiconductor manufacturing process, magnetoelastic energy is changed according to the relationship $H_{ef}=-(3/2)\lambda\sigma$ (where λ is a magnetostriction constant determined by a magnetic body and the typical value of the magnetostriction constant is in the range of about 100 ppm to 1000 ppm in a rare earth-transition metal alloy). The magnetoelastic energy is a portion of the magnetic anisotropy energy Ku. Therefore, when the internal stress σ is generated by the semiconductor manufacturing process, the magnetic anisotropy energy Ku of a magnetic body of the magnetic memory element is changed. As a result, the thermal stability factor is affected by the change in the magnetic anisotropy energy Ku.

Next, the influence of residual stress when the magnetic memory element is integrated to manufacture an MRAM is estimated in detail. For example, in a CMOS process, the amount of stress that is generated and remains in each element in the semiconductor manufacturing process for manufacturing an MRAM is about several hundreds of MPa. In a device that does not use magnetism, a residual stress of several hundreds of MPa causes little problem. In contrast, in the MRAM, if a case in which the magnetostriction constant is 1000 ppm and stress is 100 MPa is considered, magnetoelastic energy by the influence of stress is about $10^5$ J/m$^3$ (=$10^6$ erg/cm$^3$). For example, in a CoCrPt-based alloy used for perpendicular magnetic recording, magneto-crystalline anisotropy energy is about $10^5$ J/m$^3$ to $10^6$ J/m$^3$ (=$10^6$ erg/cm$^3$ to $10^7$ erg/cm$^3$). That is, magnetoelastic energy is the same order of magnitude as magneto-crystalline anisotropy energy. As such, the influence of the internal stress of the MRAM is closely related to the stability of magnetization. Since a residual stress has a great effect on the total sum of magnetic anisotropy energy, it is necessary to appropriately consider the residual stress generated by the semiconductor manufacturing process during the manufacture of the MRAM.

In particular, as shown in FIG. 2, the magnetic layer is strained and deformed due to a residual stress (for example, stress 101). As a result, when magnetic anisotropy energy is low, the magnetization in the perpendicular direction is likely to be inclined in the in-plane direction due to a thermal fluctuation. FIG. 2 is a plan view and a cross-sectional view illustrating a magnetic layer 20 with a circular shape and shows a case in which the residual stress is a tensile stress. As such, when the residual stress acts such that the magnetization direction is inclined from the perpendicular direction to the in-plane direction, there is a concern that the thermal stability of magnetization will be damaged and it will be difficult to obtain a thermal stability required for an MRAM.

The inventors found out the above-mentioned problems and found that it was possible to prevent the thermal stability of the magnetization of the magnetic memory element from being damaged by appropriately controlling stress or strain generated in the ferromagnetic layer of the magnetic memory element in the semiconductor manufacturing process and the stress or strain could be used to improve the thermal stability of the magnetization, thereby achieving the invention.

Means for Solving the Problems

According to an aspect of the invention, a magnetic memory element includes a first magnetic layer, an insulating layer that is formed on the first magnetic layer, and a second magnetic layer that is formed on the insulating layer. At least one of the first magnetic layer and the second magnetic layer is strained and deformed so as to be elongated in an easy magnetization axis direction of the magnetic layer. According to this structure, in the first magnetic layer and the second magnetic layer, magnetic anisotropy energy Ku increases, and it is possible to improve the thermal stability of the magnetization of a recording layer.

In the above-mentioned aspect of the invention, the magnetic memory element may further include an underlayer or a substrate that is provided below the first magnetic layer and is made of a material with a thermal expansion coefficient greater than that of the first magnetic layer. The underlayer or the substrate may be contracted to compress the first magnetic layer, thereby generating the compressive stress. Since the first magnetic layer is compressed by the contraction of the underlayer or the substrate, the compressive stress is generated in the first magnetic layer. A compressive stress is also generated in the second magnetic layer. Therefore, the compressive stress can be used to improve the thermal stability of the magnetization of the first magnetic layer and the second magnetic layer. The effect of improving thermal stability is noticeable in the first magnetic layer.

The invention may be implemented as a storage device.

Effects of the Invention

According to the invention, it is possible to generate residual stress or strain deformation in a magnetic layer in a semiconductor manufacturing process and actively use the generated stress or strain to improve the thermal stability of the magnetization of the magnetic layer, thereby preventing the magnetization direction of the magnetic layer from being inclined or improving the thermal stability of recorded magnetization.

BEST MODE FOR CARRYING OUT THE INVENTION

Hereinafter, exemplary embodiments of the invention will be described with reference to the accompanying drawings.

Figure 3:
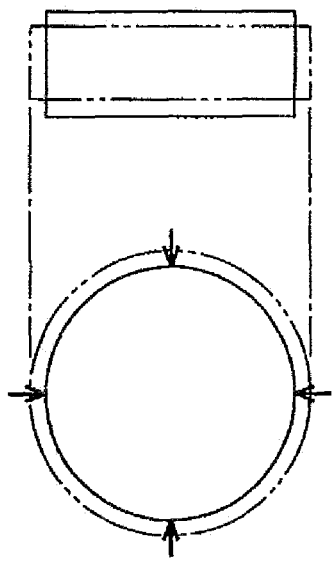
FIG. 3 is a diagram illustrating a state in which compressive stress is applied to the center of a magnetic layer in the in-plane direction.

In an aspect of the invention, a strain deformation is actively used to prevent the deterioration of the thermal stability of the magnetization of a recording layer or improve the thermal stability. Next, the operation of the strain deformation in the above-mentioned case will be described. It is assumed that there is a magnetic layer without a strain deformation as represented by a two-dot chain line in a plan view and a front view of FIG. 3 and the stress in a radius direction is uniformly applied to the center of the magnetic layer from all directions, that is, a centrosymmetric stress is applied. As a result, as represented by a solid line in FIG. 3, the magnetic layer is strained and deformed such that the size (radius or diameter) thereof in the plane is slightly reduced and the thickness thereof slightly increases. An arrow in the plan view of FIG. 3 indicates the displacement of a circumferential portion in the deformation. In the invention, this state is defined as a state in which a centrosymmetric compressive stress is applied in the in-plane direction. As such, when a compressive stress is applied in the in-plane (film surface) direction, the magnetic layer is compressed in the in-plane direction such that the size thereof is reduced and is elongated in the longitudinal direction (perpendicular direction). Therefore, when a compressive stress is applied to the in-plane direction, a perpendicular magnetization film is strained and deformed so as to be elongated in the easy magnetic axis direction, that is, the film thickness direction. In this way, it is possible to increase the magnetic anisotropy energy of the magnetization film and thus improve the thermal stability of perpendicular magnetization in a direction perpendicular to the film. For ease of understanding, a small deformation is enlarged in the drawings.

Figure 4:
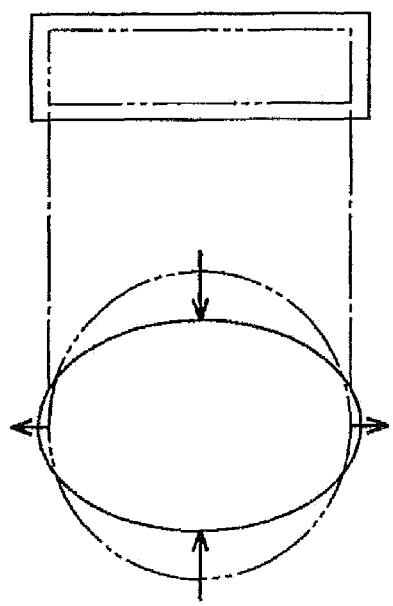
FIG. 4 is a diagram illustrating a state in which stress is applied to the magnetic layer in a one-axis direction of the in-plane direction.

FIG. 4 shows another aspect of the strain deformation. FIG. 4 is a plan view and a front view showing a magnetic layer. In FIG. 4, a compressive stress is applied from both sides (the vertical direction of the plan view) in one direction in the plane and the stress is applied so as to be symmetric with respect to the axis, not the center, unlike FIG. 3. In the invention, this state is defined as a state in which a compressive stress is applied in a one-axis direction of the in-plane direction. When a compressive stress is applied in a one-axis direction of the in-plane direction, the magnetic layer is strained and deformed so as to be contracted in the vertical direction and be elongated in the horizontal direction of the plan view. In addition, the magnetic layer is strained and deformed so as to be elongated in the longitudinal direction (perpendicular direction) of the front view. Therefore, in this case, when the first magnetic layer is an in-plane magnetization film and an elongated direction (the horizontal direction of the plan view) is aligned with the easy magnetization axis, magnetic anisotropy energy increases. Even when the first magnetic layer is a perpendicular magnetization film, magnetic anisotropy energy increases since the first magnetic layer is elongated in the perpendicular direction. Therefore, when a compressive stress is applied in the one-axis direction of the in-plane direction, it is possible to strain and deform the magnetic layer so as to be elongated in the easy magnetization axis direction, regardless of whether the magnetization layer is a horizontal magnetization film or a perpendicular magnetization film. As a result, it is possible to improve the thermal stability of the magnetization of the magnetization layer.

According to a preferred aspect of the invention, the first magnetic layer and the second magnetic layer may be perpendicular magnetization films, and at least one of the first magnetic layer and the second magnetic layer may be strained and deformed so as to be elongated in a direction perpendicular to the surface of the film. According to this structure, the stress generated in the first magnetic layer and the second magnetic layer can be used to improve the stability of recorded magnetization in the perpendicular magnetization film.

According to another preferred aspect of the invention, the first magnetic layer and the second magnetic layer may be in-plane magnetization films, and at least one of the first magnetic layer and the second magnetic layer may be strained and deformed such that the magnetic layer has an elliptical or rectangular in-plane shape and is elongated in a long axis direction. According to this structure, it is possible to increase magnetic anisotropy energy and improve the thermal stability of recorded magnetization in the in-plane magnetization film.

In the invention, the magnetic memory element may further include an interlayer insulating film that comes into contact with a side surface of the first magnetic layer and a side surface of the second magnetic layer and insulates the side surface of the first magnetic layer and the side surface of the second magnetic layer from other metal materials. At least one of the first magnetic layer and the second magnetic layer may be compressed by the interlayer insulating film from the side surface to be strained and deformed. The interlayer insulating film compresses the first magnetic layer and the second magnetic layer from the side surface to generate a compressive stress in the in-plane direction of the first and second magnetic layers. In this way, it is possible to improve the thermal stability of recorded magnetization.

In the invention, the magnetic memory element may further include an underlayer or a substrate that is provided below the first magnetic layer and is made of a material with a thermal expansion coefficient greater than that of the first magnetic layer. The underlayer or the substrate may be contracted to compress the first magnetic layer, thereby straining and deforming at least one of the first magnetic layer and the second magnetic layer. That is, since the first magnetic layer is compressed by the contraction of the underlayer or the substrate, a compressive stress is generated in the first magnetic layer. The compressive stress is also generated in the second magnetic layer. Therefore, the compressive stress can be used to improve the thermal stability of the magnetization of the first magnetic layer and the second magnetic layer. The effect of improving thermal stability is noticeable in the first magnetic layer.

According to an aspect of the invention, a magnetic memory element includes a first magnetic layer, an insulating layer that is formed on the first magnetic layer, and a second magnetic layer that is formed on the insulating layer. A compressive stress remains in any direction in the plane of at least one of the first magnetic layer and the second magnetic layer. In the first magnetic layer and the second magnetic layer, magnetic anisotropy energy Ku increases, and it is possible to improve the thermal stability of recorded magnetization. The compressive stress applied in any direction in the plane includes a compressive stress applied to the center of the plane or uniaxial compressive stress.

In the invention, the magnetic memory element may further include an interlayer insulating film that comes into contact with a side surface of the first magnetic layer and a side surface of the second magnetic layer and insulates the side surface of the first magnetic layer and the side surface of the second magnetic layer from other metal materials. The interlayer insulating film compresses the first magnetic layer or the second magnetic layer from the side surface to generate the compressive stress. According to this structure, the interlayer insulating film compresses the first magnetic layer and the second magnetic layer from the side surface to generate a compressive stress in the first and second magnetic layers. In this way, it is possible to improve the thermal stability of recorded magnetization.

In any aspect of the invention, the first magnetic layer or the second magnetic layer may be a single-layer film made of a rare earth-transition metal alloy or a multi-layered film of a rare earth-transition metal alloy and a spin-polarized film. According to this structure, since the thermal stability of the magnetization of the rare earth-transition metal alloy is greatly changed by stress, it is possible to effectively use the stress generated in the first magnetic layer and the second magnetic layer to improve the stability of recorded magnetization. The rare earth-transition metal alloy includes as components a rare earth-based element, such as Gd, Tb, or Dy, and a transition metal element, such as Fe or Co. In addition, the spin-polarized film means a magnetic film in which spin is completely polarized in the $\Delta 1$ band, such as a Fe, FeCo, or FeCoB film. It is possible to increase an effective spin polarization ratio by combining the spin-polarized film with an insulating layer having fourfold symmetry in the stacking direction, such as an MgO film, to form a spin tunnel junction. In this structure, it has been experimentally and theoretically found that it is possible to optimize conditions to obtain a magnetoresistance ratio of about 1000%.

In this case, the first magnetic layer or the second magnetic layer may be a multi-layered film of a rare earth-transition metal alloy and a FeCo alloy thin film or a FeCoB alloy thin film. It has been experimentally found that, when the FeCo alloy thin film has a multi-layered structure of FeCo, MgO, and FeCo, a magnetoresistance ratio of 200% or more is obtained, and the FeCo alloy thin film can have good characteristics as the spin-polarized film. In addition, since the FeCoB alloy thin film is an amorphous thin film, it is possible to form a large film with uniform film quality, without depending on a base.

In any aspect of the invention, the first magnetic layer or the second magnetic layer may be a single-layer granular perpendicular magnetization film or a multi-layered film of a granular perpendicular magnetization film and a spin-polarized film. It is possible to stabilize the magnetization direction of the granular perpendicular magnetization film to the perpendicular direction using stress and improve the thermal stability of recorded magnetization. The granular perpendicular magnetization film means a magnetic film in which granular or columnar chunks of perpendicular magnetization metal are dispersed in an insulator or a non-magnetic material, such as $CoCrPt-SiO_2$. In this case, the first magnetic layer or the second magnetic layer may be a multi-layered film of a granular perpendicular magnetization film and a FeCo alloy thin film or a FeCoB alloy thin film.

The magnetic memory element according to an embodiment of the invention may be applied to a storage device that uses the magnetic memory element as a storage element. In this case, the storage device may include a plurality of the magnetic memory elements and a sealing package that is obtained by curing a liquid sealing material and has the plurality of magnetic memory elements sealed therein. By contraction when the sealing material is cured, the first magnetic layer or the second magnetic layer of the magnetic memory element may be strained and deformed so as to be elongated in a direction perpendicular to the surface of the layer or a compressive stress may remain in any direction in the plane of at least one of the first magnetic layer and the second magnetic layer. That is, a tensile force acting on the element when the sealing agent is cured is used to elongate the magnetic layer (first or second magnetic layer) in the perpendicular direction of the storage element. When the magnetic layer is elongated in the perpendicular direction, it is contracted in the in-plane (the surface of the layer) direction. Therefore, a compressive stress is generated in the in-plane direction. The compressive stress can be used to improve the thermal stability of recorded magnetization.

The storage device according to the invention may include a die frame on which a substrate having a plurality of the magnetic memory elements provided thereon is placed and a sealing package that is obtained by curing a liquid sealing material and has the plurality of magnetic memory elements and the die frame sealed therein. The die frame may be warped to strain and deform the first magnetic layer or the second magnetic layer of the magnetic memory element so as to be elongated in a direction perpendicular to the surface of the layer or make a compressive stress remain in any direction in the plane of the first magnetic layer or the second magnetic layer. The sealing material may be cured with the die frame being warped, thereby sealing the die frame in the sealing package.

First Embodiment

Figure 1:
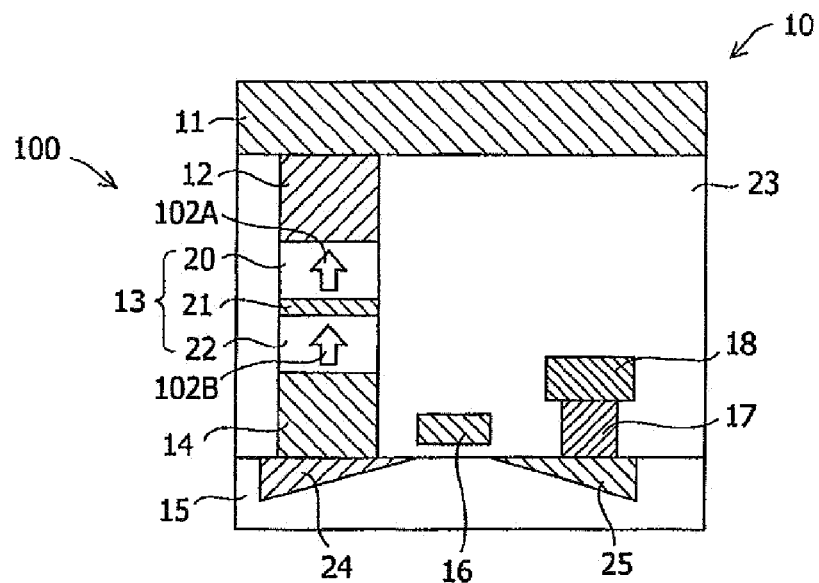
FIG. 1 is a cross-sectional view illustrating an example of the structure of a magnetic memory element according to the related art.
Figure 2:
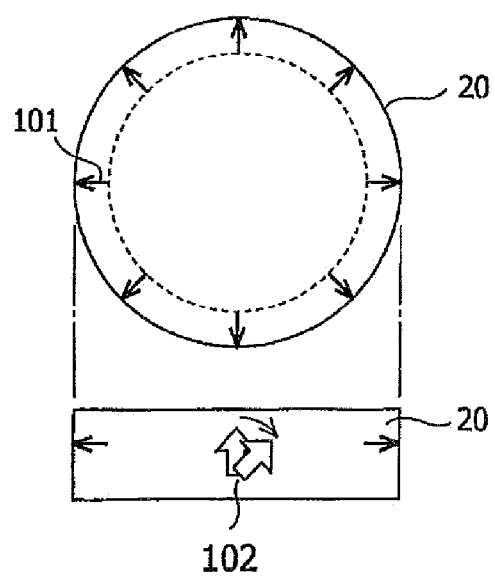
FIG. 2 is a conceptual diagram illustrating an aspect in which the stability of magnetization is reduced due to stress and magnetization is inclined.
Figure 5:
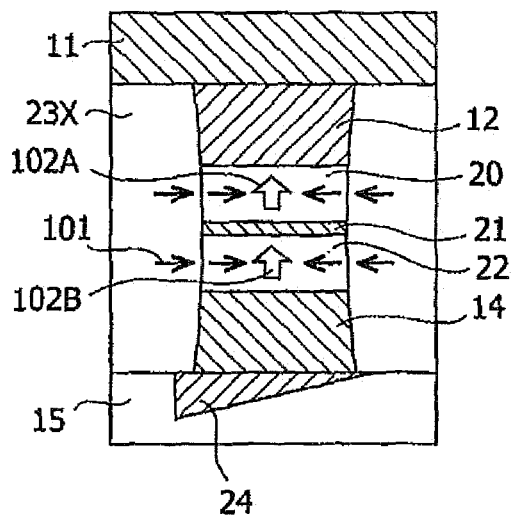
FIG. 5 is a cross-sectional view illustrating the structure of a magnetic memory element (Example 1) according to a first embodiment of the invention.

Hereinafter, exemplary embodiments of the invention will be described with reference to the drawings. FIG. 5 shows a first embodiment of the invention. In FIG. 5, the same components as those in FIG. 1 are denoted by the same reference numerals and a description thereof will be omitted. In FIG. 5, an interlayer insulating film 23X is used to apply compressive stress to a fixed layer 22 and a recording layer 20 from the side surfaces of the fixed layer 22 and the recording layer 20, thereby straining and deforming the fixed layer 22 and the recording layer 20 such that an in-plane shape extending in the easy magnetization axis direction is obtained. In this way, the thermal stability of recorded magnetization is improved by a compressive stress or strain deformation extending in the easy magnetization axis direction.

The internal stress of the interlayer insulating film 23 depends on the conditions (for example, gas pressure, a target composition, and a sputtering voltage) of a process of forming the interlayer insulating film 23. In the related art, when the internal stress of the interlayer insulating film 23 increases, the interlayer insulating film is strained and deformed, and the strain deformation causes the distortion of, for example, an MTJ portion 13, an upper electrode 12, or a lower electrode 14 coming into contact with the interlayer insulating film 23. For this reason, it is not preferable to increase the internal stress of the interlayer insulating film 23. That is, in the related art, the interlayer insulating film 23 is formed by adjusting the conditions of a film forming process such that an internal stress is as small as possible. For example, the interlayer insulating film 23 is formed by generating plasma using both a high-frequency power source and a low-frequency power source and adjusting the ratio of high frequency power and low frequency power such that the stress generated in the interlayer insulating film 23 is minimized.

In contrast, in the structure according to the embodiment of the invention shown in FIG. 5, the strain deformation of the interlayer insulating film 23 is actively used. That is, in a process of forming the interlayer insulating film 23, the interlayer insulating film 23 is formed such that the internal stress thereof increases, thereby generating expansion (strain deformation). The interlayer insulating film formed under the above-mentioned conditions is shown as the interlayer insulating film 23X. In the embodiment shown in FIG. 5, the recording layer 20 and the fixed layer 22 are compressed in the in-plane direction by the expanded interlayer insulating film 23X. Therefore, a compressive stress is generated in the recording layer 20 and the fixed layer 22, and the compressive stress changes the internal magnetic anisotropy energy of the recording layer 20 and the fixed layer 22 such that the thermal stability of magnetization is improved. In this way, it is possible to improve the thermal stability of recorded magnetization.

When the recording layer 20 and the fixed layer 22 are not perpendicular magnetization films, it is necessary to form the MTJ portion 13 in, for example, an elliptical shape or a rectangular shape in the plane. In contrast, when the layers are perpendicular magnetization films, it is possible to set the aspect ratio of the element shape to 1. The reason is as follows. When the magnetization direction is in-plane magnetization, the symmetry of the in-plane shape of the element is reduced and it is necessary to limit the magnetization direction. However, when the magnetization direction can be aligned with a direction perpendicular to the surface of the film, it is not necessary to limit the magnetization direction. Therefore, in the magnetic memory element shown in FIG. 5, when the recording layer 20 and the fixed layer 22 are perpendicular magnetization films as shown in FIG. 1, it is possible to form an element in a high-symmetry shape, such as a square shape or a circular shape, in the plane and thus reduce the area of the element, as compared to the structure in which an in-plane magnetization film is used. As a result, it is possible to increase the density of elements.

Second Embodiment

Figure 6:
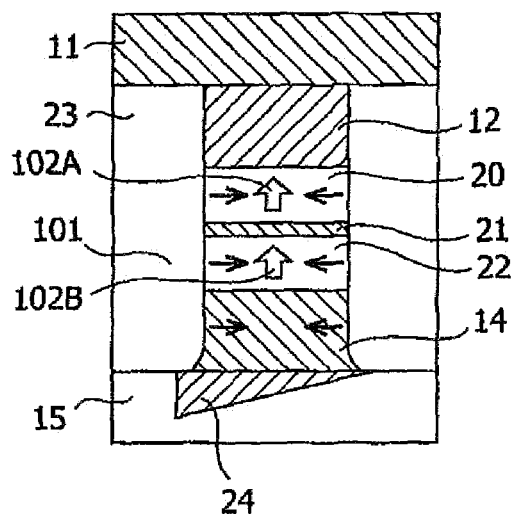
FIG. 6 is a cross-sectional view illustrating the structure of a magnetic memory element (Example 2) according to a second embodiment of the invention.

FIG. 6 shows a second embodiment. The structure shown in FIG. 6 differs from the structure shown in FIG. 1 in that the lower electrode 14 is made of a material with a thermal expansion coefficient greater than those of the recording layer 20 and the fixed layer 22. That is, in this embodiment, the contractile force of the lower electrode 14 is used to compress the fixed layer 22 and the recording layer 20.

First, when the fixed layer 22 and the recording layer 20 are formed, the lower electrode 14 is heated to be expanded. When the lower electrode 14 is cooled to a room temperature after the fixed layer 22 and the recording layer 20 are formed, the fixed layer 22 and the recording layer 20 are contracted by the contractile force of the lower electrode 14. A stress 101 is generated in the fixed layer 22 and the recording layer 20 by the contraction. Since the stress 101 is a compressive stress, the thermal stability of recorded magnetization can be improved by the same effect as that of the structure shown in FIG. 5.

Third Embodiment

Figure 7:
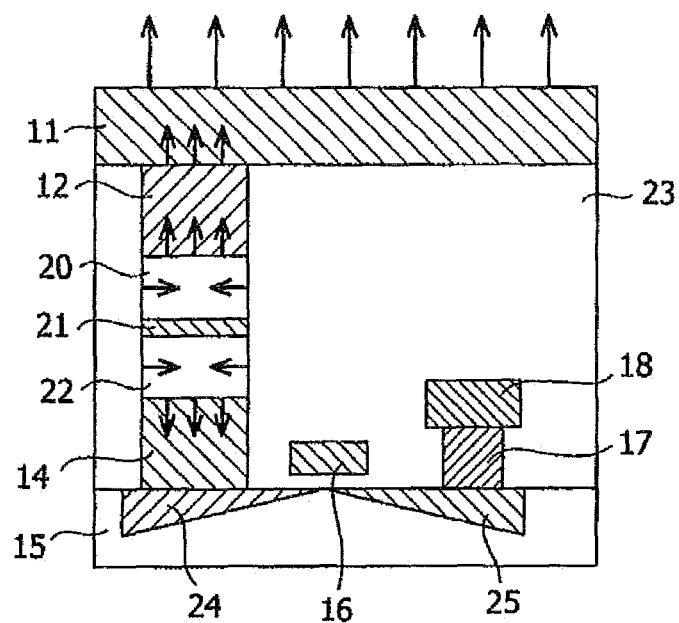
FIG. 7 is a cross-sectional view illustrating the structure of a magnetic memory element (Example 3) according to a third embodiment of the invention.

FIG. 7 shows a third embodiment. In the structure shown in FIG. 7, the contraction of a sealing agent (epoxy resin) used to seal an integrated magnetic memory element in a package is used to generate a compressive stress in the in-plane direction of the recording layer 20 and the fixed layer 22.

In general, when an element subjected to a semiconductor manufacturing process is packed, the element is sealed by a sealing material, such as an epoxy resin, in order to protect the inner element from the influence of an environment. In this embodiment, when the element is sealed by the epoxy resin, a resin that is cured to be contracted is used. In this way, as shown in FIG. 7, the element is drawn in a direction perpendicular to the surface of the film. When the element is drawn in the perpendicular direction, a magnetic layer is contracted in the in-plane direction and a compressive stress is generated in the in-plane direction. It is possible to improve the thermal stability of the recorded magnetization of a perpendicular magnetization film by the same effect as that in FIG. 5, which is obtained by the compressive stress.

Fourth Embodiment

Figure 8:
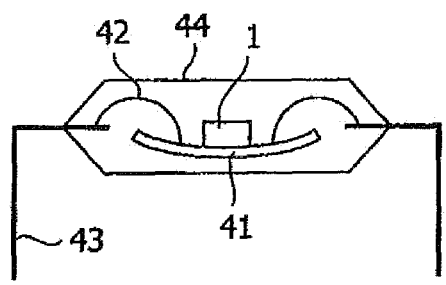
FIG. 8 is a cross-sectional view illustrating the structure of an MRAM (Example 4) according to a fourth embodiment of the invention.

FIG. 8 shows a fourth embodiment. In FIG. 8, a magnetic memory element is integrated into an MRAM, and an MRAM chip 1 is mounted on a die frame 41. The MRAM chip 1 is connected to a lead frame 43 by bonding wires 42. The MRAM chip 1 and the die frame 41 are sealed in a resin package 44. In this embodiment, when the MRAM chip is sealed in the resin package in the last stage of the semiconductor manufacturing process, the resin is cured with the die frame 41 and the MRAM chip 1 being warped. In this way, a compressive stress is applied to the magnetic layer of the MRAM chip. Although not shown in the drawings, holding frames surrounding the die frame 41 and the MRAM chip 1 are provided in order to maintain the warped state of the die frame 41 and a substrate of the MRAM chip, and the holding frames come into contact with the lower sides of the left and right ends of the die frame 41 in FIG. 8 and the upper side of the MRAM chip 1 in the downward and upward directions to generate a stress in the MRAM chip 1. In this way, it is possible to seal each holding frame in the resin package. In this embodiment, the resin that is cured to be contacted may not be necessarily used.

Example 1

A method of manufacturing a magnetic memory element according to Example 1 which is manufactured by the first embodiment will be described below referring to FIG. 5 again. First, a drain region 24, a source region 25, and a gate electrode 16 are formed on a Si substrate (silicon wafer) 15 by a CMOS process. Then, an Al film (5 nm) is formed by a magnetron sputtering method. Then, a lower electrode 14 is formed on the drain region 24 and a contact 17 is formed on the source region 25 by photolithography. In addition, a Cu film (10 nm) is formed by the magnetron sputtering method, and a gate line 18 is formed on the source region 25 by photolithography.

Then, TbFeCo (5 nm), FeCoB (1 nm), MgO (1 nm), FeCoB (1 nm), TbFeCo (5 nm), Ta (5 nm), Ru (5 nm), and Ta (3 nm) films are formed in this order, and the multi-layered film is microfabricated into a circular element with a diameter of 50 nm to 100 nm by a photolithography process. At that time, an interlayer insulating film (SiN) is formed by a plasma CVD (chemical vapor deposition) process while a resist remains. In the plasma CVD process, a reaction gas is a mixed gas of silane ($SiH_4$) and ammonia ($NH_3$), the substrate is heated at 400° C., and a 13.56-MHz high-frequency power source is used as a power source for generating plasma to generate plasma with an output of about 1 kW to 2.5 kW. After the interlayer insulating film is formed with a thickness of about 100 nm in this way, the resist used in the previous photolithography process is cleaned with a solvent, such as acetone or NMP (N-methyl-2-pyrrolidone). Then, Ta (10 nm), Cu (500 nm), and Ta (10 nm) films are formed in this order by magnetron sputtering and a Ta/Cu/Ta multi-layered portion is processed in a bit line shape by photolithography. In this way, it is possible to manufacture the magnetic memory element according to Example 1 of the invention.

Next, the effect of the structure of the magnetic memory element according to Example 1 will be described. In the plasma CVD process during the formation of the interlayer insulating film 23, when the frequency of the plasma generating power source is high (for example, 13.56 MHz), a tensile stress is generated in the SiN film, and when the frequency is low (for example, 250 kHz), a compressive stress is generated in the SiN film. In the related art, it was considered that an increase in the internal stress of the interlayer insulating film 23 was not preferable. That is, in the related art, in the plasma CVD process, for example, both the high-frequency power source and the low-frequency power source were used to generate plasma (dual frequency), and the ratio of high frequency power and low frequency power was adjusted to minimize the stress generated in the interlayer insulating film 23.

In contrast, in the structure shown in FIG. 5, the strain deformation of the interlayer insulating film 23 is actively used. That is, in the plasma CVD process of the interlayer insulating film 23, since the film is formed by, for example, high frequency plasma, a tensile stress (~600 MPa) is generated in the interlayer insulating film 23. The interlayer insulating film 23 is expanded in the forward direction in the plane of the film by the tensile stress and is then strained and deformed (~0.15%). The expanded interlayer insulating film 23 presses the side portions of the surface recording layer 20 and the fixed layer 22 in all directions to be compressed in the in-plane direction. At that time, when it is assumed that the strain deformation of the interlayer insulating film 23 is transferred to the recording layer 20 and the fixed layer 22, a compressive stress of about 150 MPa is generated in the recording layer 20 and the fixed layer 22. The compressive stress changes the internal magnetic anisotropy energy of the recording layer 20 and the fixed layer 22 such that the thermal stability of magnetization is improved. In a thin film made of an alloy, such as TbFeCo, TbFe, GdFeCo, GdFe, DyFeCo, or DyFe which is known as a rare earth-transition metal alloy, a magnetostriction constant $\lambda$ is changed in the range of 100 ppm to 1000 ppm depending on a composition. If a composition is adjusted such that the magnetostriction constant is 1000 ppm, magnetic anisotropy energy is improved by about $1.5 \times 10^5$ J/m$^3$ ($=1.5 \times 10^6$ erg/cm$^3$), and thermal stability is improved by about 200 KuV/k$_B$T. Therefore, it is possible to ensure sufficient thermal stability of an MRAM.

In Example 1, a single high-frequency power source (~13.56 MHz) is used as the power source for generating plasma during the formation of the interlayer insulating film 23. In addition to the high-frequency power source, a low-frequency power source (~250 kHz) may be used in order to improve the quality of a film, that is, the property of a film, such as step coverage or moisture resistance. In this case, when the output power of the high-frequency power source is more than that of the low-frequency power source, it is possible to improve the quality of a film (step coverage and moisture resistance) while maintaining the thermal stability of recorded magnetization.

In Example 1, plasma CVD is used as a method of forming the interlayer insulating film 23, but thermal CVD may be used to form the interlayer insulating film 23. For example, when the entire magnetic memory element is heated in a mixed gas of a silane (SiH$_4$) gas and an ammonia (NH$_3$) gas at a temperature of 900° C. or more, it is also possible to generate a tensile stress in the interlayer insulating film 23. In Example 1, the SiN film is used as the interlayer insulating film 23. However, for example, a SiO$_2$ film, a PSG film, and a TEOS film may be used as the interlayer insulating film 23. In this case, it is possible to obtain the same effect as described above.

Example 2

FIG. 6 shows the structure of a magnetic memory element according to Example 2 which is manufactured by the second embodiment of the invention. In Example 2, a magnetic layer (a recording layer 20 and a fixed layer 22) and a lower electrode 14 are made of materials with different thermal expansion coefficients and a compressive stress is applied to the fixed layer 22 and the recording layer 20. A manufacturing method according to Example 2 will be described with reference to FIG. 6. First, similar to FIG. 5, a drain region 24, a source region 25, and a gate electrode 16 are formed on a Si substrate 15 by a CMOS process. Then, an Al film (5 nm) is formed by a magnetron sputtering method. Then, the lower electrode 14 is formed on the drain region 24 and a contact 17 is formed on the source region 25 by photolithography. In addition, a Cu film (10 nm) is formed by the magnetron sputtering method, and a gate line 18 is formed on the source region 25 by photolithography.

Then, the entire Si substrate 15 is heated to about 300° C. to 400° C. Then, TbFeCo (5 nm), FeCoB (1 nm), MgO (1 nm), FeCoB (1 nm), TbFeCo (5 nm), Ta (5 nm), Ru (5 nm), and Ta (3 nm) films are formed in this order while a high temperature of 300° C. to 400° C. is maintained. Then, the multi-layered film is cooled to a room temperature. Then, the multi-layered film is microfabricated by a photolithography process such that the in-plane shape thereof is a circle with a diameter of 50 nm to 100 nm. In addition, an interlayer insulating film (SiN) is formed by a plasma CVD process while a resist remains. In the plasma CVD process, a reaction gas is a mixed gas of silane (SiH$_4$) and ammonia (NH$_3$), the substrate is heated at 400° C., and a 13.56-MHz high-frequency power source and a 250-kHz low-frequency power source are used as a power source for generating plasma to generate plasma with a total output of about 1 kW to 2.5 kW. After the interlayer insulating film is formed with a thickness of about 100 nm, the resist used in the previous photolithography process is cleaned with acetone or NMP. Then, Ta (10 nm), Cu (500 nm), and Ta (10 nm) films are formed in this order by magnetron sputtering and a Ta/Cu/Ta multi-layered portion is processed in a bit line shape by photolithography. In this way, the structure according to Example 2 is manufactured.

Next, the effect of the structure of the magnetic memory element according to Example 2 will be described. When a TbFeCo/FeCoB/MgO/FeCoB/TbFeCo film is formed, the substrate is heated and the lower electrode 14 is thermally expanded. In this state, the magnetic layer is formed. When the thermal expansion coefficient of Al (lower electrode 14) in the range of the room temperature to 400° C. is in the range of about 23 ppm/K to 28 ppm/K and the thermal expansion coefficient of TbFeCo is 8 ppm/K, which is a general value of the thermal expansion coefficient of an amorphous Fe-based alloy, a compressive stress is applied to the TbFeCo layer from the interface with the lower electrode 14 by the difference between the thermal expansion coefficients, and a maximum compressive stress of 650 MPa remains in the layer. When the compressive stress is considered as magnetic anisotropy energy similar to the above, magnetic anisotropy energy is increased by $6.5 \times 10^5$ J/m$^3$ ($=6.5 \times 10^6$ erg/cm$^3$). As a result, thermal stability is considerably improved.

Preferably, during the writing of data, since the element is heated by a current flowing through the element, a contractile stress due to the difference between the thermal expansion coefficients is reduced, and thermal stability is reduced. That is, during writing, it is possible to reduce thermal stability to decrease the amount of current required for writing. As described above, according to the magnetic memory element of Example 2, it is possible to improve the retention characteristics of the magnetic memory element and reduce the amount of current required to write data.

In the structure of the magnetic memory element according to Example 2, the lower electrode is made of aluminum (Al). However, the lower electrode may be made of other metal materials with a large thermal expansion coefficient, such as silver (Ag), gold (Au), and copper (Cu). The thermal expansion coefficients of the metal materials are as follows: silver: 20 ppm/K; gold: 14 ppm/K; and copper: 17 ppm/K.

Example 3

Figure 9:
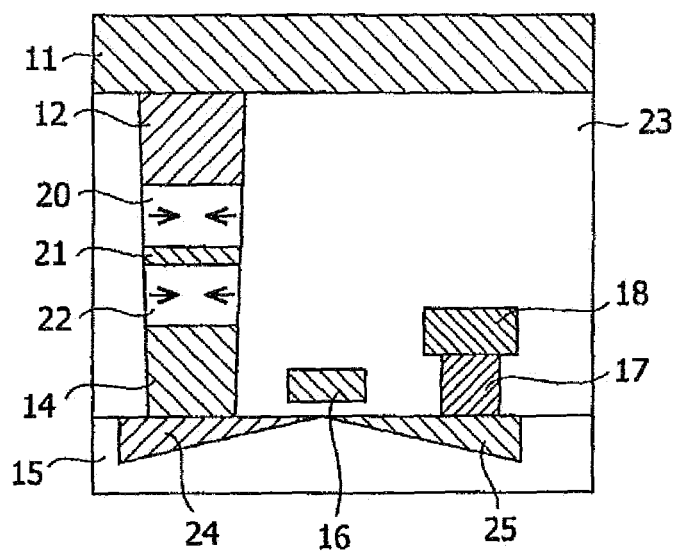
FIG. 9 is a cross-sectional view illustrating the structure of the magnetic memory element according to the third embodiment and Example 3 of the invention.
Figure 10:
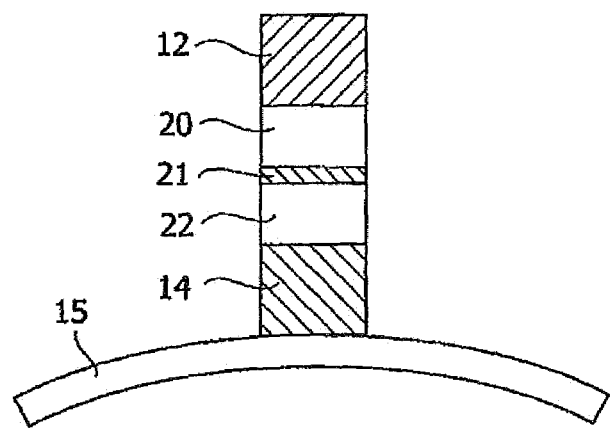
FIG. 10 is a diagram illustrating a method of manufacturing the magnetic memory element according to Example 3 of the invention.

A magnetic memory element according to Example 3 which is manufactured as the third embodiment of the invention has a structure shown in FIG. 9. In FIG. 9, a magnetic layer is formed with a Si substrate 15 warped in a mountain shape, as shown in FIG. 10, and the Si substrate 15 returns to a flat state after the magnetic layer is formed. In this way, a compressive stress remains in the magnetic layer. A method of manufacturing the structure according to Example 3 will be described. First, similar to FIG. 5, a drain region 24, a source region 25, and a gate electrode 16 are formed on the Si substrate 15 by a CMOS process. Then, an Al film (5 nm) is formed by a magnetron sputtering method. Then, a lower electrode 14 is formed on the drain region 24 and a contact 17 is formed on the source region 25 by photolithography. In addition, a Cu film (10 nm) is formed by the magnetron sputtering method, and a gate line 18 is formed on the source region 25 by photolithography.

Then, as shown in FIG. 10, the Si substrate 15 is fixed by a jig so as to be warped in a mountain shape with a curvature radius R of 2 m. In this state, TbFeCo (5 nm), FeCoB (1 nm), MgO (1 nm), FeCoB (1 nm), TbFeCo (5 nm), Ta (5 nm), Ru (5 nm), and Ta (3 nm) films are formed in this order. Then, the warped Si substrate 15 is removed from the jig to have elasticity. Then, the multi-layered film is microfabricated into a circular element with a diameter of 50 nm to 100 nm by a photolithography process. In addition, an interlayer insulating film (SiN) is formed by a plasma CVD process while a resist remains. In the plasma CVD process, a reaction gas is a mixed gas of silane ($SiH_4$) and ammonia ($NH_3$), the substrate is heated at 400° C., and a 13.56-MHz high-frequency power source and a 250-kHz low-frequency power source are used as a power source for generating plasma to generate plasma with a total output of about 1 kW to 2.5 kW. After the interlayer insulating film is formed with a thickness of about 100 nm, the resist used in the previous photolithography process is cleaned with acetone or NMP. Then, Ta (10 nm), Cu (500 nm), and Ta (10 nm) films are formed in this order by magnetron sputtering and a Ta/Cu/Ta multi-layered portion is processed in a bit line shape by photolithography. In this way, the magnetic memory element according to Example 3 is manufactured.

Next, the effect of the magnetic memory element according to Example 3 will be described. When the magnetic layer (TbFeCo and FeCoB) is formed on the warped Si substrate 15 and the Si substrate 15 returns to a flat state, a compressive stress σ generated in the magnetic layer can be calculated from the formula of mechanics of materials:

$$\sigma = \frac{h_s^2}{6h_f R} \frac{E}{1-\gamma}$$ [Expression 1]

(where $h_S$ is the thickness of a substrate, $h_f$ is the thickness of a thin film, γ is the Poisson's ratio, E is the Young's modulus, and R is a curvature radius).

In the expression, when the thickness of the substrate is 300 μm, the thickness of the thin film is 5 nm, the Poisson's ratio γ is 0.3, the Young's modulus E is 98 GPa (the typical value of iron), and the curvature radius R is 2 m, a compressive stress of 210 GPa is generated. Similar to the above, when the compressive stress is converted into magnetic anisotropy energy, the magnetic anisotropy energy is improved by about $2.1 \times 10^5$ J/m$^3$ ($=2.1 \times 10^6$ erg/cm$^3$). As a result, thermal stability is improved.

Example 4

An MRAM according to Example 4 which is manufactured by the fourth embodiment of the invention has a structure shown in FIG. 8. An example of a method of manufacturing the structure shown in FIG. 8 will be described below. A method of manufacturing a magnetic memory element integrated into an MRAM chip may be the same as that in Examples 1 to 3, or the magnetic memory element may be manufactured by the method according to the related art. After a process of forming a bit line ends, the Si substrate is diced into chips. Then, an MRAM chip 1 is fixed to a die frame 41 made of, for example, copper phosphate by silver paste. After the MRAM chip 1 is connected to a lead frame 43 by bonding wires 42, a resin flows into a mold with the die frame 41 being warped in a concave shape with a curvature radius R of 2 m in the mold, thereby sealing the chip. In this way, the magnetic memory element according to Example 4 is manufactured.

The effect of the MRAM according to Example 4 shown in FIG. 8 will be described below. A compressive stress generated in the magnetic layer (TbFeCo or FeCoB) in the MRAM chip 1 which is warped together with the die frame 41 can be calculated by Expression 1. As a result of the calculation, it is expected that each magnetic memory element of the MRAM according to Example 4 will have the effect of improving thermal stability, similar to Example 3, that is, magnetic anisotropy energy will be improved by about $2.1 \times 10^5$ J/m$^3$ ($=2.1 \times 10^6$ erg/cm$^3$).

The simplest method of checking the degree of strain of the magnetic layer is to measure a lattice constant using cross-section TEM. The strain is easily calculated by comparing a bulk lattice constant with the lattice constant measured by cross-section TEM. However, it is difficult to apply this method to an amorphous magnetic body.

Figure 11:
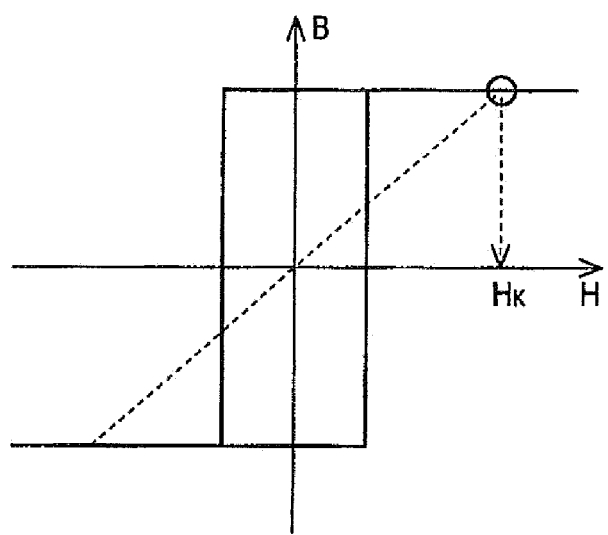
FIG. 11 is a characteristic diagram illustrating a method of measuring magnetic anisotropy energy.

Another method is to measure magnetization characteristics using, for example, VSM (Vibrating Sample Magnetometer) or SQUID (Superconducting Quantum Interference Device). FIG. 11 shows an example of the measurement of magnetization characteristics, in which a solid line indicates the magnetization characteristics in the easy magnetization axis direction and a dotted line indicates the magnetization characteristics in the hard magnetization axis direction. In this case, an anisotropy field Hk may be measured as follows. A normal line at the origin of the magnetization characteristics in the hard magnetization axis direction is extrapolated and the intensity of the magnetic field at an intersection point with the magnetization characteristics in the easy magnetization axis direction is measured as the anisotropy field Hk.

When the anisotropy field Hk is calculated, magnetic anisotropy energy Ku may be calculated by a relational expression Ku=2MsHk. In a rare earth-transition metal alloy (TbFeCo, TbFe, GdFeCo, GdFe, DyFeCo, or DyFe), magnetic anisotropy energy is determined by a composition and an internal stress. Therefore, films with the same composition, thickness, and structure (for example, TbFeCo (5 nm), FeCoB (1 nm), MgO (1 nm), FeCoB (1 nm), TbFeCo (5 nm), Ta (5 nm), and Ru (5 nm)) are formed on the entire surface of a glass substrate, and a variation in magnetic anisotropy energy is calculated from the magnetic anisotropy energy of the entire film and the magnetic anisotropy energy of the magnetic memory element. When the same film structure is used, a variation in magnetic anisotropy energy is a variation in magnetoelastic energy. Therefore, it is possible to indirectly measure a variation in internal stress from the following relationship: magnetoelastic energy $H_{el}=-(3/2)\lambda\sigma$, and it is possible to estimate a strain S from the Young's modulus E and internal stress $\sigma$ since the relationship $S=E\sigma$ is established between the internal stress $\sigma$ and the strain S.

The embodiments of the invention have been described above, but the invention is not limited to the above-described embodiment. Various modifications and changes of the invention can be made without departing from the scope and spirit of the invention.

The invention claimed is:

1. A storage device comprising:
   a plurality of magnetic memory elements; and
   a sealing package that is obtained by curing a liquid sealing material, the sealing package having the plurality of magnetic memory elements sealed therein,
   each magnetic memory element including:
      a lower electrode;
      an upper electrode; and
      a magnetic tunnel junction portion that includes a first magnetic layer, an insulating layer that is formed on the first magnetic layer, and a second magnetic layer that is formed on the insulating layer, the magnetic tunnel junction portion being provided between the lower electrode and the upper electrode,
   wherein, by contraction when the sealing material is cured, the first magnetic layer or the second magnetic layer of at least one of the magnetic memory elements is strained and deformed so as to be elongated in a direction perpendicular to a surface of the respective magnetic layer such that compressive stress is generated and remains in an in-plane direction of the respective magnetic layer.

2. The storage device according to claim 1,
   wherein the first magnetic layer and the second magnetic layer are perpendicular magnetization films, and
   at least one of the first magnetic layer and the second magnetic layer being strained and deformed so as to be elongated in a direction perpendicular to a surface of the respective film.

3. The storage device according to claim 1,
   wherein the first magnetic layer and the second magnetic layer are in-plane magnetization films, and
   at least one of the first magnetic layer and the second magnetic layer is strained and deformed such that the magnetic layer has an elliptical or rectangular in-plane shape defining a long axis and a short axis and the magnetic layer being elongated in a direction along the long axis direction of the in-plane shape.

4. The storage device according to claim 1,
   wherein the first magnetic layer or the second magnetic layer is a single-layer film made of a rare earth-transition metal alloy or a multi-layered film of a rare earth-transition metal alloy and a spin-polarized film.

5. The storage device according to claim 4,
   wherein the first magnetic layer or the second magnetic layer is a multi-layered film of a rare earth-transition metal alloy and a FeCo alloy thin film or a FeCoB alloy thin film.

6. The storage device according to claim 1,
   wherein the first magnetic layer or the second magnetic layer is a single-layer granular perpendicular magnetization film or a multi-layered film of a granular perpendicular magnetization film and a spin-polarized film.

7. The storage device according to claim 6,
   wherein the first magnetic layer or the second magnetic layer is a multi-layered film of a granular perpendicular magnetization film and a FeCo alloy thin film or a FeCoB alloy thin film.

* * * * *